United States Patent
Harris et al.

(10) Patent No.: US 11,802,923 B2
(45) Date of Patent: Oct. 31, 2023

(54) SYSTEM AND METHOD FOR REDUCING PERIPHERAL NERVE STIMULATION AT HIGHER GRADIENT AMPLITUDES AND FASTER GRADIENT SLEW RATES IN MAGNETIC RESONANCE IMAGING

(71) Applicant: SYNAPTIVE MEDICAL INC., Toronto (CA)

(72) Inventors: Chad Tyler Harris, Toronto (CA); Geron André Bindseil, Toronto (CA); William Bradfield Handler, Toronto (CA)

(73) Assignee: Synaptive Medical Inc.

( * ) Notice: Subject to any disclaimer, the term of this patent is extended or adjusted under 35 U.S.C. 154(b) by 0 days.

(21) Appl. No.: 17/819,690

(22) Filed: Aug. 15, 2022

(65) Prior Publication Data
US 2022/0390535 A1    Dec. 8, 2022

Related U.S. Application Data

(63) Continuation of application No. 16/346,470, filed as application No. PCT/IB2016/056565 on Oct. 31, 2016, now Pat. No. 11,428,760.

(51) Int. Cl.
    *G01V 3/175*        (2006.01)
    *G01R 33/28*       (2006.01)
    (Continued)

(52) U.S. Cl.
    CPC ......... *G01R 33/288* (2013.01); *G01R 33/385* (2013.01); *G01R 33/42* (2013.01); *G01V 3/175* (2013.01)

(58) Field of Classification Search
    CPC .............. G01R 33/3415; G01R 33/543; G01R 33/5659; G01R 33/36; A61B 5/055
    (Continued)

(56) References Cited

U.S. PATENT DOCUMENTS

| | | | |
|---|---|---|---|
| 2007/0163365 A1* | 7/2007 | Reed ....................... | G01L 1/205 340/665 |
| 2008/0103576 A1* | 5/2008 | Gerber ................ | A61N 1/0529 607/116 |
| 2010/0308829 A1* | 12/2010 | Vu ........................... | H03K 6/04 327/291 |

FOREIGN PATENT DOCUMENTS

GB      2206764 A   *   1/1989      ........... A61B 5/0017

OTHER PUBLICATIONS

Harris et al., "System and Method for Reducing Peripheral Nerve Stimulation at Higher Gradient Amplitudes and Faster Gradient Slew Rates in Magnetic Resonance Imaging", U.S. Appl. No. 16/346,470, filed Jun. 30, 2019, Notice of Allowance issued.

* cited by examiner

*Primary Examiner* — Walter L Lindsay, Jr.
*Assistant Examiner* — Frederick Wenderoth

(57) ABSTRACT

Systems and methods for imaging a subject with a magnetic resonance imaging system using magnetic field gradients generated by one or more gradient coils operating with gradient coil settings, such as gradient amplitudes and gradient slew rates, above a threshold at which peripheral nerve stimulation is likely to be induced in the subject. A dielectric assembly is positioned adjacent a skin surface of the subject such that the dielectric assembly attenuates the local electric fields induced by the magnetic field gradients, which would be likely to induce PNS when the dielectric assembly is not arranged adjacent the skin surface of the subject. As a result of the dielectric assembly placed adjacent the skin surface of the subject, the gradient coil settings can be increased above the threshold without inducing PNS in the subject.

18 Claims, 3 Drawing Sheets

(51) Int. Cl.
*G01R 33/385* (2006.01)
*G01R 33/42* (2006.01)
(58) Field of Classification Search
USPC .......................................................... 324/309
See application file for complete search history.

SYSTEM AND METHOD FOR REDUCING PERIPHERAL NERVE STIMULATION AT HIGHER GRADIENT AMPLITUDES AND FASTER GRADIENT SLEW RATES IN MAGNETIC RESONANCE IMAGING

CROSS-REFERENCE TO RELATED APPLICATION(S)

This document is a continuation application, claiming the benefit of, and priority to, U.S. patent application Ser. No. 16/346,470, entitled "System and Method for Reducing Peripheral Nerve Stimulation at Higher Gradient Amplitudes and Faster Gradient Slew Rates in Magnetic Resonance Imaging," and filed on Apr. 30, 2019, and International Application No. PCT/IB2016/056565, entitled "System and Method for Reducing Peripheral Nerve Stimulation at Higher Gradient Amplitudes and Faster Gradient Slew Rates in Magnetic Resonance Imaging," and filed on Oct. 31, 2016, all of which are hereby incorporated herein by reference in their entirety.

BACKGROUND

During magnetic resonance imaging ("MRI") procedures, magnetic field gradients or other time-varying magnetic fields may stimulate nerves or muscles in patients by inducing electrical fields. The potential for interactions between magnetic field gradients and biological tissues is dependent on a variety of factors including the fundamental field frequency, the maximum flux density, the average flux density, the presence of harmonic frequencies, the waveform characteristics of the signal, the polarity of the signal, the current distribution in the body, the electrical properties, and the sensitivity of the cell membrane.

Peripheral nerve stimulation ("PNS") is a physiological effect of the interaction of nerves with switching (a.k.a., slewing) the gradient coil in an MRI system. Rapidly changing magnetic fields produce electric fields that can stimulate nerves in the body, which can cause uncomfortable or painful sensations. The presence of PNS limits the performance of both conventional and anatomy-specific gradient coils found in MRI systems. Without the PNS effect, gradient coils could be designed or operated to have significantly faster slew rates, greater gradient strengths, or both, which would improve imaging performance by shortening scan times or increasing image quality.

Conventional MRI systems are operated with limitations to their performance that prevent the scanner from inducing PNS in the vast majority of people. These thresholds are established for each gradient coil through empirically testing exposure of different slew rates and amplitudes for a large number of subjects. Despite these limitations, there are cases where a person's threshold for PNS is lower (i.e., more sensitive) than typical, and if such a person is being scanned and experiences PNS, the scan may be stopped, at which point adjustments to the gradient coil settings used for the pulse sequence are required to resume scanning.

There remains a need, then, to provide systems and methods that allow for an increase to the PNS thresholds in most people, which would relax gradient coil limitations and enable improved MRI performance in a wide variety of MRI tasks.

SUMMARY

The present disclosure addresses the aforementioned drawbacks by providing a method for imaging a subject with an MRI system. The method comprises selecting, with a computer system, gradient coil settings that define magnetic field gradients to be generated by a gradient coil in the MRI system. The gradient coil settings are selected based on at least one of a position, shape, size, or material of a dielectric assembly arranged adjacent a skin surface of a subject positioned within a magnetic field of the MRI system. The gradient coil settings comprise at least one of gradient amplitudes or gradient slew rates above a threshold at which peripheral nerve stimulation is likely to be induced in the subject when the dielectric assembly is not arranged adjacent the skin surface of the subject. Data are acquired from the subject with the MRI system operating to generate magnetic field gradients defined by the selected gradient coil settings. An image that depicts the subject is then reconstructed from the acquired data.

Another aspect of the present disclosure involves a method of reducing peripheral nerve stimulation in a subject during an imaging scan with an MRI system. The method comprises arranging a dielectric assembly proximate an anatomical region of the subject in which PNS is to be reduced. Gradient coil settings that define magnetic field gradients to be generated by a gradient coil in the MRI system are selected with a computer system. The gradient coil settings comprise at least one of gradient amplitudes and gradient slew rates above a threshold at which PNS is likely to be induced in the anatomical region of the subject when the dielectric assembly is not arranged proximate the anatomical region. Data are acquired from the subject with the MRI system operating to generate magnetic field gradients defined by the selected gradient coil settings. PNS is mitigated in the anatomical region by the dielectric assembly. An image that depicts the subject is then reconstructed from the acquired data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the present disclosure; however, and reference is, therefore, made to the claims and herein for interpreting the scope of the invention.

DETAILED DESCRIPTION

Described herein are systems and methods for safely imaging a subject with an MRI system using magnetic field gradients generated by one or more gradient coils operating with gradient coil settings, e.g., gradient amplitudes and gradient slew rates, above a threshold at which PNS is likely to be induced in the subject. A dielectric assembly is positioned adjacent a skin surface of the subject such that the dielectric assembly attenuates the local electric fields induced by the magnetic field gradients, and which would, otherwise, induce PNS when the dielectric assembly is not arranged adjacent the skin surface of the subject. As a result of the dielectric assembly placed adjacent the skin surface of the subject, the gradient coil settings can be increased above the threshold without inducing PNS in the subject.

Figure 1:
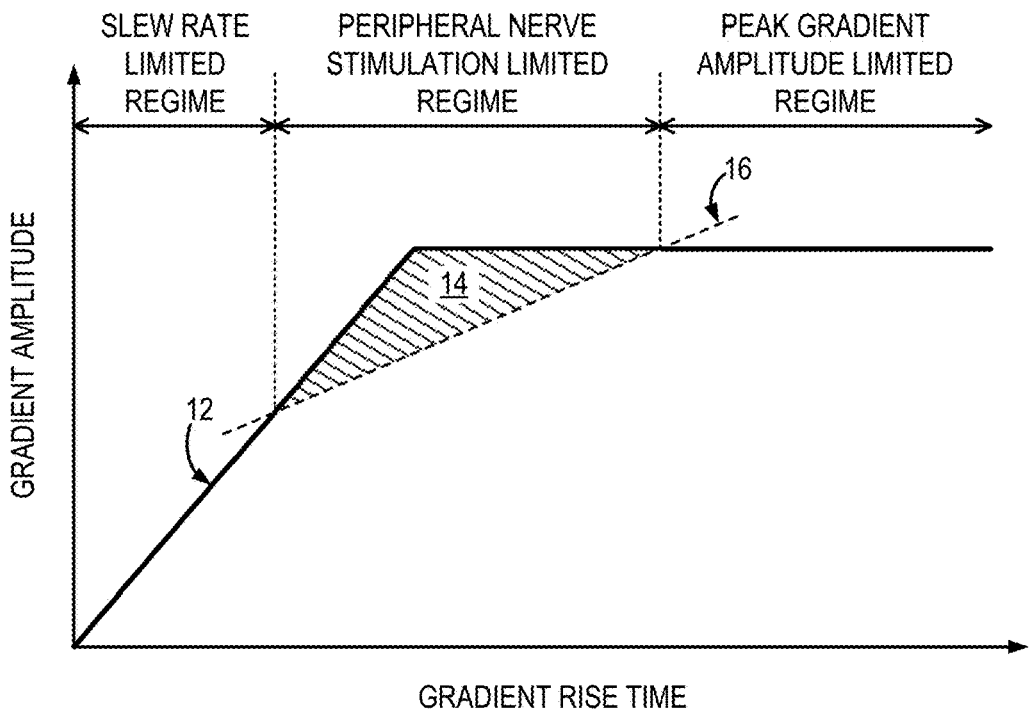
FIG. 1 is a graph illustrating gradient coil settings and the limitations that hardware and the risk of inducing PNS places on a selection of gradient coil settings for use in an MRI scan, in accordance with the related art.

Referring to FIG. 1, this graph illustrates an example plot of gradient coil settings, e.g., at least one of gradient amplitudes and gradient rise times, for a gradient coil, in accordance with the related art. Points on the graph correspond to combinations of gradient amplitude and gradient rise time values. The area above line 12 corresponds to combinations of gradient coil settings that are not attainable due to hardware limitations. For example, areas above the line 12 correspond to at least one of: gradient slew rates (which is the inverse of gradient rise time) that cannot be attained due to hardware limitations and gradient amplitudes that exceed the maximum gradient amplitude attainable with the gradient coil. Thus, areas above the line 12 generally correspond to at least one of: gradient slew rate limited regimes and gradient amplitude limited regimes.

Still referring to FIG. 1, certain combinations of gradient rise time and gradient amplitude are likely to induce PNS in an average population. These combinations correspond to the shaded region 14, which is delimited by the line 12 and the PNS threshold line 16. Gradient amplitudes and rise times that are applied below the threshold 16 do not result in PNS, while combinations of these gradient coil settings above the threshold line 16 are likely to result in PNS being induced over an average population.

Figure 2:
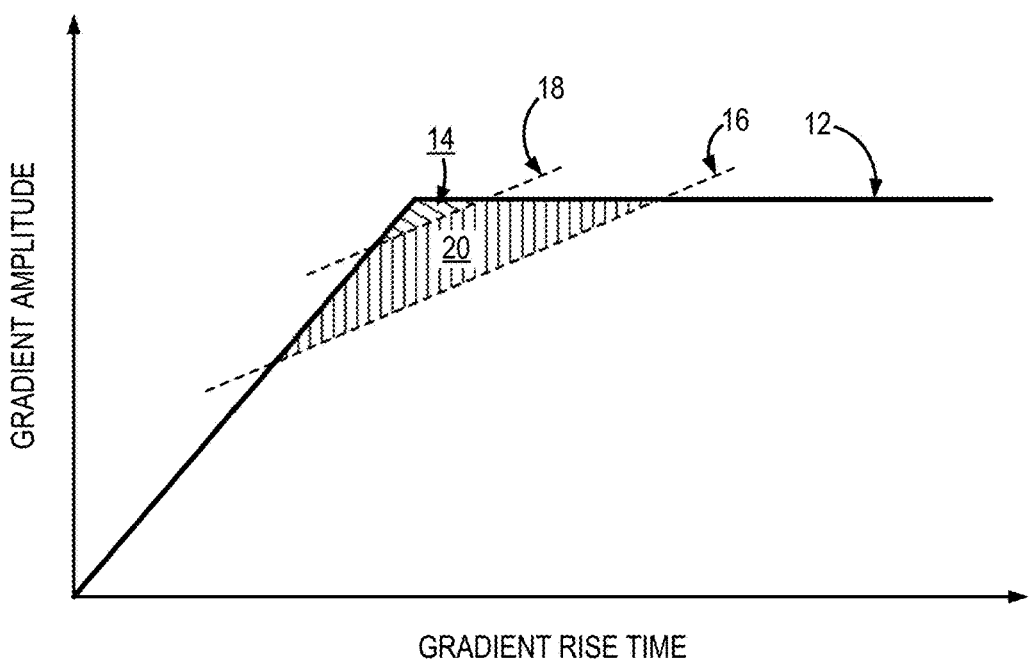
FIG. 2 is a graph illustrating an example increase in the PNS threshold for gradient coil settings achieved through the use of arranging one or more dielectric assemblies adjacent a skin surface of a subject, in accordance with an embodiment of the present disclosure.

Referring to FIG. 2, this graph illustrates a desired effect of increasing PNS thresholds by arranging one or more dielectric assemblies adjacent a skin surface of a subject, in accordance with an embodiment of the present disclosure. The dielectric assembly is configured to attenuate local electric fields that would, otherwise, induce PNS in the subject and, as such, increases the PNS threshold from line 16 to line 18. By increasing the PNS thresholds, combinations of gradient coil settings in region 20 are safely used without inducing PNS in a subject. Without arranging the dielectric assembly adjacent, the skin surface of the subject, gradient coil settings in region 20 would not be safe to use as they would be likely to induce PNS in at least some subsets of an average population.

Figure 3:
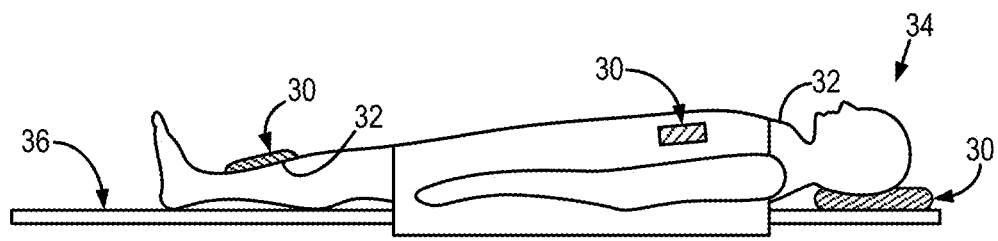
FIG. 3 is a diagram illustrating a side view of various different dielectric assemblies arranged adjacent skin surface of a subject, in accordance with an embodiment of the present disclosure.

Referring to FIG. 3, this diagram illustrates, in a side view, a dielectric assembly 30 arranged adjacent a skin surface 32 of a subject 34, in accordance with an embodiment of the present disclosure. The dielectric assembly 30 is implemented to attenuate local electrical fields in the subject 34 that would otherwise be likely to induce PNS. Specifically, the dielectric assembly 30 can attenuate local electrical fields that are produced in response to magnetic gradient fields that were generated while operating a gradient coil using gradient coil settings above a conventional PNS threshold. As such, the dielectric assembly 30 provides for safely operating the gradient coil using gradient coil setting above a conventional PNS threshold level. At least one dielectric assembly can be arranged adjacent the subject depending on the imaging task at hand.

Still referring to FIG. 3, the dielectric assembly 30 can be arranged adjacent the skin surface 32 of the subject 34 by placing the dielectric assembly 30 in direct contact with the skin surface 32 or adjacent the skin surface 32 of the subject 34 by spacing the dielectric assembly 30 at a distance from the skin surface 32, such that the dielectric assembly 30 is not in direct contact with the skin surface 32. For example, the dielectric assembly 30 can be arranged on a garment that is in direct contact with the skin surface 32 of the subject 34. As another example, the dielectric assembly 30 can be provided to the subject 34 via an adhesive bandage such that the dielectric assembly 30 is arranged adjacent, but not in direct contact with, the skin surface 32 of the subject 34.

Still referring to FIG. 3, the dielectric assembly 30 comprises pads, fabrics, or enclosures containing gels or liquids. In general, such gels or liquids comprise gel-based dielectric materials, liquid water-based dielectric materials, and mixtures of particulates in a liquid or gel. As an example, dielectric materials comprise slurries or gels containing barium titanate ($BaTiO_3$) or calcium titanate ($CaTiO_3$) In these latter examples, the dielectric material comprises a dense aqueous suspension of $BaTiO_3$ or $CaTiO_3$ form-able into flexible pads, such as by heat sealing the suspension between two flexible substrates. In any case, the dielectric assembly 30 comprises one or more dielectric materials or media. In some configurations, the dielectric assembly 30 is rigid, while, in other configurations, the dielectric assembly 30 is flexible or otherwise conformable to the skin surface 32 of the subject 34.

Still referring to FIG. 3, As one example, the dielectric assembly 30 comprises a thin fabric containing a dielectric material. In this configuration, the dielectric assembly 30 can be formed as a part of a garment to be worn by the subject 34. For instance, the dielectric assembly 30 comprises flexible pads or fabrics coupled with a garment to be worn by the subject 34 during an imaging session. In such examples, the garment can be tight-fitting so as to place the dielectric assembly 30 into close proximity to the skin surface 32 of the subject 34.

Still referring to FIG. 3, in another example, the dielectric assembly 30 comprises a rigid, or flexible, pad directly disposable over specific regions of the subject 34 where PNS is likely or otherwise expected to occur. The dielectric assembly 30 comprises enclosures, the enclosures containing gels or liquids, and the gels or liquids comprising dielectric materials or media. Such enclosures can be rigid or flexible. As one example, the dielectric assembly 30 comprises a gel pack containing a dielectric media, such as a hydrogel. As another example, the dielectric assembly 30 comprises a flexible or otherwise conformable enclosure, e.g., a plastic bag or the like, containing water.

Still referring to FIG. 3, the dielectric assembly 30 can be sized, shaped, or otherwise dimensioned to optimize the reduction of PNS in a particular region of a subject. To this end, a PNS test protocol can be conducted to establish population-general limits for specific geometries of pads, or the like, placed on the subject's body. As one example, in whole-body MRI systems, PNS may commonly occur in the arms, legs, or back, and different dielectric assemblies 30 can be constructed to be optimally sized, shaped, or otherwise dimensioned for these different anatomical regions.

Still referring to FIG. 3, in some configurations, the dielectric assembly 30 is incorporated into the patient table 36. As one example, one or more dielectric assemblies 30 can be constructed as pads that are built into the patient table 36 to reduce PNS that may, otherwise, be induced in the subject's back. The dielectric assembly 30 can be constructed as a pad or pillow on which the subject's head can rest. As another example, one or more dielectric assemblies 30 comprises tubes or sheaths into which the subject's arms or legs could be placed to reduce PNS that may, otherwise, be induced in the extremities of the subject 34. As another example, the dielectric assembly 30 comprises a cap or mask that is placed over the subject's head or face.

Figure 4:
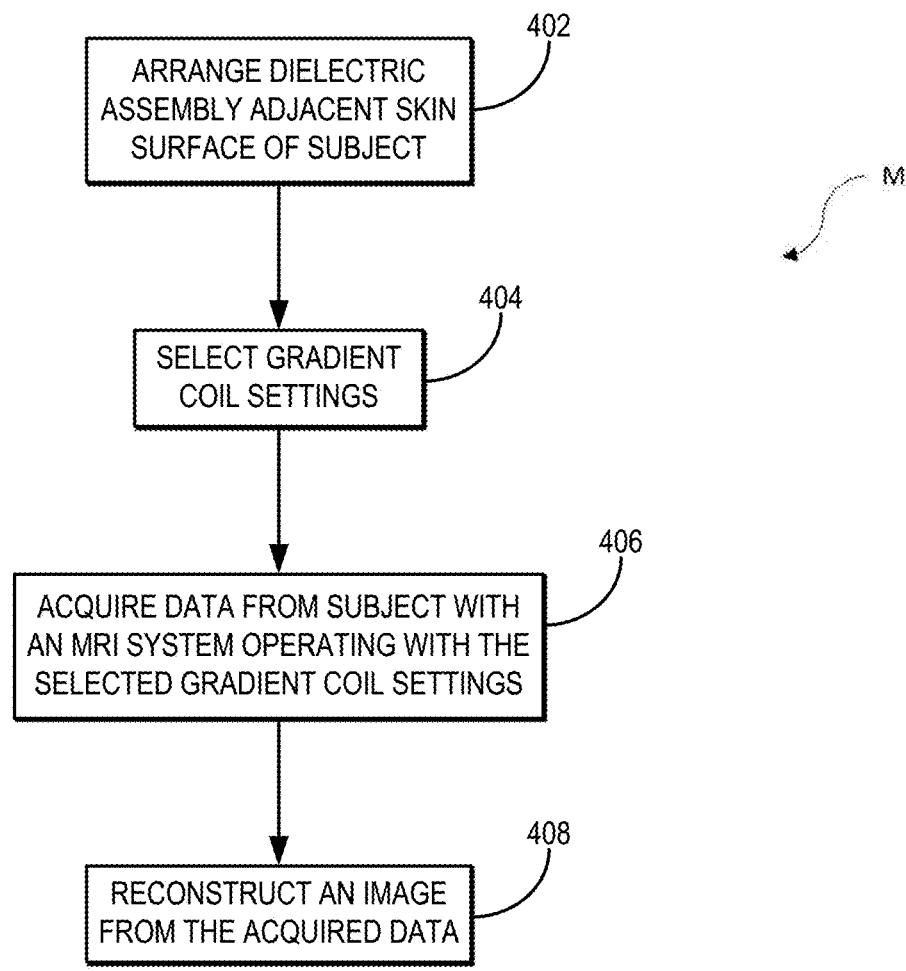
FIG. 4 is a flowchart illustrating an example method of imaging a subject using one or more dielectric assemblies arranged adjacent a skin surface of the subject so as to allow the use of gradient coil settings that, absent the dielectric assemblies, would otherwise induce PNS in the subject, in accordance with an embodiment of the present disclosure.

Referring to FIG. 4, this flowchart illustrates a method M of imaging a subject 34 using one or more dielectric assemblies 30 arranged adjacent a skin surface 32 of the subject 34 so as to allow the use of gradient coil settings that, absent the dielectric assemblies 30, would otherwise induce PNS in the subject 34, in accordance with an embodiment of the present disclosure. The method M comprises arranging one or more dielectric assemblies 30 adjacent the skin surface 32 of the subject 34, as indicated at step 402. Examples of such dielectric assemblies 30 are above described, e.g., in relation to FIG. 3. IN performing step 402, a dielectric assembly 30 can be arranged adjacent the skin surface 32 of the subject 34 by placing the dielectric assembly 30 in direct contact of the skin surface 32, or the dielectric assembly 30 can be arranged adjacent to the skin surface 32 without directly contact the skin surface 32. For example, the dielectric assembly 30 can be arranged adjacent the skin surface 32 of the subject 34 with a garment or other intervening object, e.g., air, between the dielectric assembly 30 and the skin surface 32 of the subject 34. Arranging the one or more dielectric assemblies 30 adjacent the skin surface 32 of the subject 34, as indicated by step 402, preferably comprises arranging the one or more dielectric assemblies 30 proximate to regions in the subject 34 that are likely to be affected by PNS. Example regions can include the extremities, the back, the neck, and the head.

Still referring to FIG. 4, the method M comprises setting gradient coil settings with a computer system, as indicated at step 404. The gradient coil settings are selected based on the one or more dielectric assemblies 30 arranged adjacent a skin surface 32 of the subject 34. In particular, the gradient coil settings are selected to include a combination of settings, e.g., gradient amplitude, gradient rise time, or slew rate, which would likely result in generating magnetic field gradients that would induce PNS in the subject, but for the one or more dielectric assemblies being arranged adjacent the skin surface of the subject. In this manner, gradient coil settings that would otherwise not be safely implemented can be used. Advantageously, these gradient coil settings can result in generating stronger gradients, faster switching gradients, or both, which can improve imaging tasks such as diffusion imaging where stronger magnetic field gradients and faster gradient switching can be used to improve diffusion encoding. After the gradient coil settings are selected in step 404, data are acquired from the subject with the MRI system, as recited in step 406. In particular, the MRI system S is configured to perform a pulse sequence that includes generating magnetic field gradients based on the selected gradient coil settings. One or more images of the subject 34 can then be reconstructed from the acquired data, as indicated at step 408.

Figure 5:
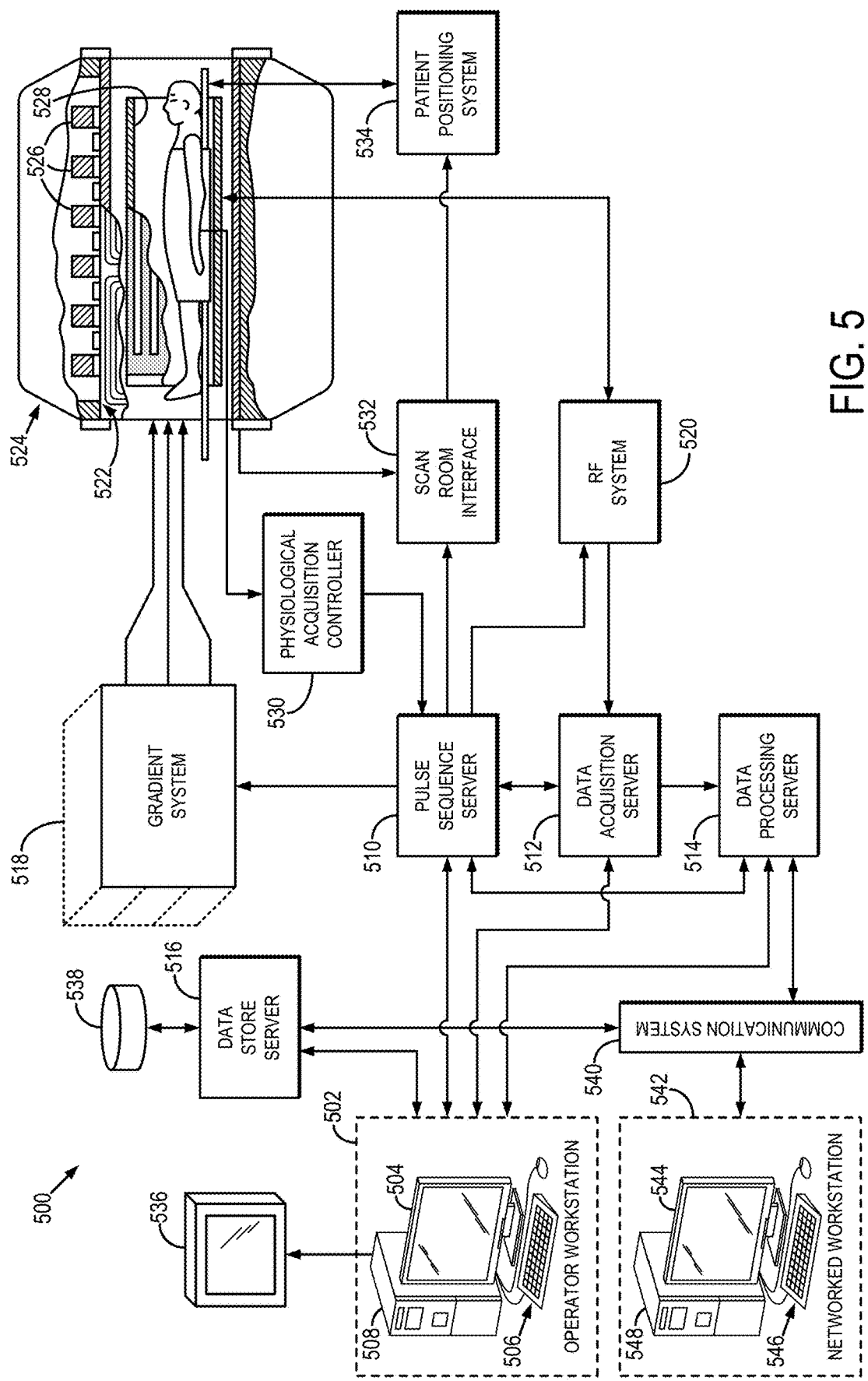
FIG. 5 is a block diagram illustrating an MRI system that can implement the methods described in the present disclosure, such as shown in FIG. 4, in accordance with an embodiment of the present disclosure.

Referring to FIG. 5, this block diagram illustrates an MRI system 500 that can implement the methods described in the present disclosure, e.g., the method M, as shown in FIG. 4, in accordance with an embodiment of the present disclosure. The MRI system 500 comprises an operator workstation 502, the operator workstation 502 comprising a display 504, one or more input devices 506, e.g., a keyboard and a mouse, and a processor 508. The processor 508 comprises a programmable machine running an operating system. The operator workstation 502 provides an operator interface that facilitates entering scan parameters into the MRI system 500. The operator workstation 502 may be coupled with different servers, such as, for example, a pulse sequence server 510, a data acquisition server 512, a data processing server 514, and a data store server 516, via a communication system 540, the communication system 540 comprising one of at least one wired connection or at least one wireless network connection.

Still referring to FIG. 5, the pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. These gradient waveforms can be defined by gradient coil settings, e.g., gradient amplitudes and gradient slew rates, selected based on the presence of one or more dielectric assemblies arranged adjacent the skin surface 32 of the subject 34 being imaged, or otherwise arranged proximate an anatomical region in which PNS is more likely to be induced in the subject 34. The gradient coil assembly 522 forms part of a magnet assembly 524 that includes a polarizing magnet 526 and an RF coil 528, which may be a whole-body RF coil.

Still referring to FIG. 5, RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the RF coil 528 or to one or more local coils or coil arrays.

Still referring to FIG. 5, the RF system 520 also includes one or more RF receiver channels. An RF receiver channel includes an RF preamplifier that amplifies the magnetic resonance signal received by the RF coil 528 to which the RF preamplifier is coupled, and a detector that detects and digitizes the I and Q quadrature components of the received magnetic resonance signal. The magnitude of the received magnetic resonance signal is, therefore, determined at a sampled point by the square root of the sum of the squares of the I and Q components: $M=\sqrt{I2+Q2}$ (Eq. 1); and the phase of the received MR signal is determined according to the following relationship: $\varphi=\tan^{-1}(Q/I)$ (Eq. 2).

Still referring to FIG. 5, the pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from respiratory bellows or other respiratory monitoring devices. These signals may be used by the pulse sequence server 510 to synchronize, or "gate," the performance of the scan with the subject's heartbeat or respiration. The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

Still referring to FIG. 5, the digitized MR signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey such information to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

Still referring to FIG. 5, the data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms, e.g., iterative or back-projection reconstruction algorithms, applying filters to raw k-space data or to reconstructed images, generating functional magnetic resonance images, or calculating motion or flow images.

Still referring to FIG. 5, the images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

Still referring to FIG. 5, the MRI system 500 comprises one or more networked workstations 542. For example, a networked workstation 542 may include a display 544, one or more input devices 546, e.g., a keyboard and a mouse, and a processor 548. The networked workstation 542 may be located within the same facility as the operator workstation 502, or in a different facility, such as a different healthcare institution or clinic. The networked workstation 542 gains remote access to the data processing server 514 or the data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present disclosure has described one or more preferred embodiments, and it should be appreciated that many equivalents, alternatives, variations, and modifications, aside from those expressly stated, are possible and within the scope of the present disclosure.

What is claimed:

1. A magnetic resonance imaging (MRI) system, comprising:
   a computing system configured to select at least one gradient coil setting based on at least one of a position, a shape, a size, and a material of a dielectric assembly disposed in relation to a skin surface of a subject, the subject disposed in relation to a magnetic field of the MRI system, the at least one gradient coil setting defining at least one magnetic field gradient to be generated by a gradient coil in the MRI system, the at least one gradient coil setting comprising at least one of a gradient amplitude and a gradient slew rate, the gradient amplitude greater than a threshold gradient amplitude at which peripheral nerve stimulation (PNS) is likely otherwise induced in the subject absent the dielectric assembly, and the gradient slew rate greater than a threshold gradient slew rate at which PNS is likely otherwise induced in the subject absent the dielectric assembly, thereby providing at least one selected gradient coil setting; and
   an imaging system configured to acquire data from the subject to generate at least one magnetic field gradient defined by the at least one selected gradient coil setting, thereby providing acquired data,
   the computing system further configured to reconstruct an image from the acquired data;
   wherein the computer system further comprises selecting at least one gradient coil setting based on at least one of a position, a shape, a size, and a material of a dielectric assembly disposed in relation to a skin surface of a subject, the subject disposed in relation to a magnetic field of the MRI system, the at least one gradient coil setting defining at least one magnetic field gradient to be generated by a gradient coil in the MRI system, the at least one gradient coil setting comprising at least one of a gradient amplitude and a gradient slew rate, the gradient amplitude greater than a threshold gradient amplitude at which peripheral nerve stimulation (PNS) is likely otherwise induced in the subject absent the dielectric assembly, and the gradient slew rate greater than a threshold gradient slew rate at which PNS is likely otherwise induced in the subject absent the dielectric assembly, thereby providing at least one selected gradient coil setting.

2. A method of providing a magnetic resonance imaging (MRI) system, comprising:
   providing a computing system configured to select at least one gradient coil setting based on at least one of a position, a shape, a size, and a material of a dielectric assembly disposed in relation to a skin surface of a subject, the subject disposed in relation to a magnetic field of the MRI system, the at least one gradient coil setting defining at least one magnetic field gradient to be generated by a gradient coil in the MRI system, the at least one gradient coil setting comprising at least one of a gradient amplitude and a gradient slew rate, the gradient amplitude greater than a threshold gradient amplitude at which peripheral nerve stimulation (PNS) is likely otherwise induced in the subject absent the dielectric assembly, and the gradient slew rate greater than a threshold gradient slew rate at which PNS is likely otherwise induced in the subject absent the dielectric assembly, thereby providing at least one selected gradient coil setting;

providing an imaging system configured to acquire data from the subject to generate at least one magnetic field gradient defined by the at least one selected gradient coil setting, thereby providing acquired data;

providing the computing system further comprising configuring the computing system to reconstruct an image from the acquired data; and using the computer system, selecting at least one gradient coil setting based on at least one of a position, a shape, a size, and a material of a dielectric assembly disposed in relation to a skin surface of a subject, the subject disposed in relation to a magnetic field of the MRI system, the at least one gradient coil setting defining at least one magnetic field gradient to be generated by a gradient coil in the MRI system, the at least one gradient coil setting comprising at least one of a gradient amplitude and a gradient slew rate, the gradient amplitude greater than a threshold gradient amplitude at which peripheral nerve stimulation (PNS) is likely otherwise induced in the subject absent the dielectric assembly, and the gradient slew rate greater than a threshold gradient slew rate at which PNS is likely otherwise induced in the subject absent the dielectric assembly, thereby providing at least one selected gradient coil setting.

3. A method of imaging by way of a magnetic resonance imaging (MRI) system having a computer system, comprising:

providing the MRI system, providing the MRI system comprising:

providing a computing system configured to select at least one gradient coil setting based on at least one of a position, a shape, a size, and a material of a dielectric assembly disposed in relation to a skin surface of a subject, the subject disposed in relation to a magnetic field of the MRI system, the at least one gradient coil setting defining at least one magnetic field gradient to be generated by a gradient coil in the MRI system, the at least one gradient coil setting comprising at least one of a gradient amplitude and a gradient slew rate, the gradient amplitude greater than a threshold gradient amplitude at which peripheral nerve stimulation (PNS) is likely otherwise induced in the subject absent the dielectric assembly, and the gradient slew rate greater than a threshold gradient slew rate at which PNS is likely otherwise induced in the subject absent the dielectric assembly, thereby providing at least one selected gradient coil setting; and providing an imaging system configured to acquire data from the subject to generate at least one magnetic field gradient defined by the at least one selected gradient coil setting, thereby providing acquired data, providing the computing system further comprising configuring the computing system to reconstruct an image from the acquired data;

using the computer system, selecting at least one gradient coil setting based on at least one of a position, a shape, a size, and a material of a dielectric assembly disposed in relation to a skin surface of a subject, the subject disposed in relation to a magnetic field of the MRI system, the at least one gradient coil setting defining at least one magnetic field gradient to be generated by a gradient coil in the MRI system, the at least one gradient coil setting comprising at least one of a gradient amplitude and a gradient slew rate, the gradient amplitude greater than a threshold gradient amplitude at which peripheral nerve stimulation (PNS) is likely otherwise induced in the subject absent the dielectric assembly, and the gradient slew rate greater than a threshold gradient slew rate at which PNS is likely otherwise induced in the subject absent the dielectric assembly, thereby providing at least one selected gradient coil setting;

using the MRI system, acquiring data from the subject to generate at least one magnetic field gradient defined by the at least one selected gradient coil setting, thereby providing acquired data; and using the computer system, reconstructing an image from the acquired data.

4. The MRI system of claim 1, further comprising the dielectric assembly configured to arrange proximate the skin surface of the subject.

5. The MRI system of claim 4, wherein the dielectric assembly is further configured to one of:
arrange in contact with the skin surface of the subject;
space a distance from the skin surface of the subject; and
arrange proximate an anatomical region-of-interest that is sensitive to PNS.

6. The MRI system of claim 1, wherein the dielectric assembly comprises at least one of a flexible material, a rigid material, and a gel material.

7. The MRI system of claim 6, wherein at least one of:
the flexible material comprises at least one of a dielectric material and a fabric;
the rigid material comprises the dielectric material; and
the gel material comprises the dielectric material.

8. The MRI system of claim 1, wherein at least one of:
the at least one selected gradient coil setting comprises a gradient amplitude greater than the threshold gradient amplitude at which PNS is otherwise induced in the subject absent the dielectric assembly; and
the at least one selected gradient coil setting comprises a gradient slew rate greater than the threshold gradient slew rate at which PNS is otherwise induced in the subject absent the dielectric assembly.

9. The method of claim 2, further comprising providing the dielectric assembly configured to arrange proximate the skin surface of the subject.

10. The method of claim 9, wherein providing the dielectric assembly further comprises configuring the dielectric assembly to one of:
arrange in contact with the skin surface of the subject;
space a distance from the skin surface of the subject; and
arrange proximate an anatomical region-of-interest that is sensitive to PNS.

11. The method of claim 2, wherein providing the dielectric assembly comprises providing at least one of a flexible material, a rigid material, and a gel material.

12. The method of claim 11, wherein at least one of:
providing the flexible material comprises providing the flexible material with at least one of a dielectric material and a fabric;
providing the rigid material comprises providing the rigid material with the dielectric material; and
providing the gel material comprises providing the gel material with the dielectric material.

13. The method of claim 2, wherein providing the computing system comprises configuring the computing system to select the at least one gradient coil setting as at least one of:
the at least one selected gradient coil setting comprises a gradient amplitude greater than the threshold gradient amplitude at which PNS is otherwise induced in the subject absent the dielectric assembly; and
the at least one selected gradient coil setting comprises a gradient slew rate greater than the threshold gradient slew rate at which PNS is otherwise induced in the subject absent the dielectric assembly.

14. The method of claim 3, further comprising providing the dielectric assembly configured to arrange proximate the skin surface of the subject.

15. The method of claim 14, wherein providing the dielectric assembly further comprises configuring the dielectric assembly to one of:
arrange in contact with the skin surface of the subject;
space a distance from the skin surface of the subject; and
arrange proximate an anatomical region-of-interest that is sensitive to PNS.

16. The method of claim 14, wherein providing the dielectric assembly comprises providing at least one of a flexible material, a rigid material, and a gel material.

17. The method of claim 16, wherein at least one of:
providing the flexible material comprises providing the flexible material with at least one of a dielectric material and a fabric;
providing the rigid material comprises providing the rigid material with the dielectric material; and
providing the gel material comprises providing the gel material with the dielectric material.

18. The method of claim 2, wherein providing the computing system comprises configuring the computing system to select the at least one gradient coil setting as at least one of:
the at least one selected gradient coil setting comprises a gradient amplitude greater than the threshold gradient amplitude at which PNS is otherwise induced in the subject absent the dielectric assembly; and
the at least one selected gradient coil setting comprises a gradient slew rate greater than the threshold gradient slew rate at which PNS is otherwise induced in the subject absent the dielectric assembly.

* * * * *